(12) United States Patent
Khalifa

(10) Patent No.: US 10,539,348 B2
(45) Date of Patent: Jan. 21, 2020

(54) POWER AND REFRIGERATION CASCADE SYSTEM

(71) Applicant: H. Ezzat Khalifa, Manlius, NY (US)

(72) Inventor: H. Ezzat Khalifa, Manlius, NY (US)

(73) Assignee: SYRACUSE UNIVERSITY, Syracuse, NY (US)

( * ) Notice: Subject to any disclaimer, the term of this patent is extended or adjusted under 35 U.S.C. 154(b) by 464 days.

(21) Appl. No.: 13/939,384

(22) Filed: Jul. 11, 2013

(65) Prior Publication Data

US 2013/0312435 A1 Nov. 28, 2013

Related U.S. Application Data

(62) Division of application No. 12/187,863, filed on Aug. 7, 2008, now abandoned.

(60) Provisional application No. 60/954,346, filed on Aug. 7, 2007.

(51) Int. Cl.
  *F25B 29/00* (2006.01)
(52) U.S. Cl.
  CPC .................. *F25B 29/006* (2013.01)
(58) Field of Classification Search
  CPC ...... F25B 15/00; F25B 15/006; F25B 25/005; F25B 27/02; F25B 29/006; F25B 27/00; H05K 7/20836; H05K 7/20827
  USPC ...................... 62/79, 262, 272, 285; 165/181
  See application file for complete search history.

(56) References Cited

U.S. PATENT DOCUMENTS

| | | | | | |
|---|---|---|---|---|---|
| 3,984,282 | A | * | 10/1976 | Kleimola | G21C 9/00 376/282 |
| 4,199,961 | A | * | 4/1980 | Carter | B01D 9/04 62/535 |
| 4,337,625 | A | * | 7/1982 | Wilkinson | 62/79 |
| 4,656,463 | A | * | 4/1987 | Anders | G01S 13/78 340/10.34 |

(Continued)

FOREIGN PATENT DOCUMENTS

JP  2006039916  2/2006

OTHER PUBLICATIONS

R.R. Schmidt, B.D. Notohardjono, High-End Server Low-Temperature Cooling, IBM J. of Res. & Dev., vol. 46, No. 6, Nov. 2002, pp. 739-751.

(Continued)

*Primary Examiner* — Ana M Vazquez
(74) *Attorney, Agent, or Firm* — Bond Schoeneck & King, PLLC; Frederick Price; George McGuire

(57) ABSTRACT

A combined power and refrigeration cascade system that includes an electric power system (PS) that produces both electric power and medium-to-high-grade waste heat. To reduce energy consumption by a load having a computer chip, the load is powered by a power source and thermally coupled to a refrigeration system, which is also powered by the power source. The refrigeration system is thermally coupled to an absorption system, which is configured to remove heat rejected by the refrigeration system. The refrigeration system and the absorption system are in a cascaded arrangement such that the refrigeration system condensing temperature is less than twenty degrees Celsius. In particular, absorption chillers of the absorption system and vapor-compressors of the refrigeration system are in a cascading arrangement that produces subzero cooling.

14 Claims, 9 Drawing Sheets

(56) References Cited

U.S. PATENT DOCUMENTS

| | | | |
|---|---|---|---|
| 4,745,768 A * | 5/1988 | Schorr | F25B 27/00 62/238.3 |
| 4,869,069 A * | 9/1989 | Scherer | F25B 25/02 62/79 |
| 5,020,334 A * | 6/1991 | Wilkinson | F24F 3/1417 62/271 |
| 5,438,841 A * | 8/1995 | Cahill-O'Brien | A23L 3/3418 426/418 |
| 6,126,723 A * | 10/2000 | Drost | B01B 1/005 96/108 |
| 6,276,152 B1 * | 8/2001 | Sibik | F25B 49/02 62/179 |
| 6,321,552 B1 * | 11/2001 | Frederiksen | B60H 1/32 123/41.23 |
| 6,434,955 B1 * | 8/2002 | Ng | F25B 25/00 62/106 |
| 6,868,677 B2 * | 3/2005 | Viteri | H01M 8/04022 60/39.12 |
| 7,195,282 B2 * | 3/2007 | Mizuno | B60K 1/02 220/562 |
| 2002/0021557 A1 | 2/2002 | Ishimine et al. | |
| 2002/0056288 A1 * | 5/2002 | Kim | F25B 15/006 62/476 |
| 2002/0079088 A1 * | 6/2002 | Agonafer | H01L 23/4735 165/80.4 |
| 2002/0114985 A1 * | 8/2002 | Shkolnik | H01M 8/00 429/425 |
| 2004/0011046 A1 * | 1/2004 | Pierson | F01K 23/10 60/772 |
| 2004/0086759 A1 * | 5/2004 | Parchamazad | H01M 8/04022 429/411 |
| 2004/0101724 A1 * | 5/2004 | Imamura | H01M 8/04223 429/429 |
| 2004/0267408 A1 * | 12/2004 | Kramer | H02J 3/00 700/291 |
| 2005/0022963 A1 | 2/2005 | Garragrant et al. | |
| 2005/0083657 A1 | 4/2005 | Hamman | |
| 2005/0200205 A1 * | 9/2005 | Winn | H02J 9/062 307/64 |
| 2006/0048920 A1 * | 3/2006 | Helleur | F01K 3/185 165/108 |
| 2006/0144700 A1 * | 7/2006 | Carson | A61L 2/035 204/252 |
| 2006/0256526 A1 | 11/2006 | Hamman | |
| 2007/0122670 A1 * | 5/2007 | Goto | H01M 8/04007 429/410 |
| 2008/0156033 A1 * | 7/2008 | Cur et al. | 62/448 |
| 2008/0307806 A1 * | 12/2008 | Campbell | F24F 5/0017 62/121 |
| 2009/0038324 A1 * | 2/2009 | Khalifa | F25B 27/00 62/238.3 |

OTHER PUBLICATIONS

D. Elson, 750FX and 750GX Power Dissipation Presentatio, Feb. 15, 2005.

* cited by examiner

POWER AND REFRIGERATION CASCADE SYSTEM

RELATED APPLICATION

The present application claims priority to U.S. non-provisional patent application Ser. No. 12/187,863, filed on Aug. 7, 2008, which claims priority to U.S. provisional patent application No. 60/954,346, filed on Aug. 7, 2007; all of the foregoing patent-related documents are hereby incorporated by reference herein in their respective entireties.

BACKGROUND OF THE INVENTION

Field of Invention

The present invention relates generally to combined power and cooling generation systems, and, more particularly, to a combined power and refrigeration cascade system ("PARCS") that includes an electric power system (PS) that produces both electric power and medium-to-high-grade waste heat that can be used for providing the cooling and power supply needs of data centers and the like.

Description of Prior Art

On-site power generation systems using combustion engines (for example, gas turbines) or fuel cells allow much higher energy efficiency through the utilization of the prime mover's waste heat. Such systems have been offered in a variety of configurations involving combined heat and power ("CHP"), combined cooling and power ("CCP") or combined cooling, heat and power ("CCHP"). In all these configurations, the basic distinction is the mode of waste heat utilization, which is dictated by the type of load(s) served by the system. An important factor in determining the economic effectiveness of these systems is the matching of their power and thermal output to the time varying power and thermal demands of the load(s). Ideally, the power and thermal output (heating or cooing) of an on-site system should be fully utilized by the load at all times, which occurs very rarely except when the power and thermal (e.g., cooling) demands are strongly correlated, as they are in computer data centers.

CCP and CCHP systems typically use absorption chillers to utilize the waste heat for cooling. The most common type is single-effect or double effect LiBr—$H_2O$ absorption systems (ABS), modified to operate with the lower temperature waste heat from the power system. A CCP system comprising a 30%-efficient power generation system driving an R134a vapor compression ("VC") water chiller ($COP_c$~6) and a double-effect absorption chiller ($COP_a$~1.1) can achieve a fuel-based cooling COP higher than 2.4 under typical water-cooled chiller operating conditions (5° C. evaporator/° 35 C condenser). It should be noted, however, that LiBr—$H_2O$ ABS use water as a refrigerant and cannot provide sub zero ° C. refrigeration, making such systems unsuitable for low-temperature refrigeration applications.

Systems comprising cascaded combinations of exhaust—driven ABS and VC cooling have been proposed in which the ABS acts as a heat rejection system for a bottoming VC system (see U.S. Pat. Nos. 4,745,768 and 4,869,069). While these systems offer the potential for providing efficient on-site low-temperature refrigeration, they still suffer from possible temporal mismatching when operated in grid-independent mode to serve time-dependent loads (for example, space heating and cooling or supermarket refrigeration).

Grid-independent operation offers several advantages, especially with DC power sources like fuel cells and DC loads like computers. With grid independence, in addition to avoiding the grid-connection costs and compliance with grid regulations, it is possible to eliminate several steps of power conversion from DC to AC or vice versa, which account for as much as a 50% power loss in data center applications.

Description Of the Related Art Section Disclaimer: To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

SUMMARY OF THE INVENTION

Accordingly, it would be useful and desirable for an on-site power generation system to be grid-independent (see DEFINITIONS section), especially to be grid-independent with good temporal matching, and even more especially to be grid-independent with good temporal matching under a condition of time dependent load(s). In addition it would be useful and desirable for the on-site power generation system to be able to provide combined power generation and refrigeration for loads in which the refrigeration loads are strongly correlated with the power needs, as they are in computer data centers.

Various embodiments of the present invention may exhibit one or more of the following objects, features and/or advantages:

(i) increase energy efficiency in a power and/or cooling generation system;

(ii) an electric power system (PS) that produces both electric power and medium-to-high-grade waste heat;

(iii) efficient use of waste heat for providing the cooling and power supply needs of a load;

(iv) high energy efficiency power supply and cooling for data centers or other load(s) where the need for cooling is positively correlated with the power consumption; and (v) a PARCS with 30-50% energy savings relative to a conventional power supply and cooling system.

According to an aspect of the present invention, a power and refrigeration cascade system includes an electric power system, a refrigeration system, and an absorption system. The refrigeration system is powered at least in part by the electric power system. The refrigeration system is thermally coupled to a component, wherein the component is the electric power system and/or a load powered by the electric power system. The absorption system is thermally coupled to the refrigeration system and configured to remove heat rejected by the refrigeration system. The thermal coupling between the refrigeration system and the absorption system enables a refrigeration system condensing temperature of less than approximately twenty degrees Celsius.

According to a further aspect of the present invention, an on-site power generation system includes an electric power system and a refrigeration cascade system. The refrigeration cascade system is thermally coupled to the electric power system. The refrigeration cascade system is configured to temporally match cooling needs of a load coupled to the electric power system based on actual power supplied to the load.

According to a further aspect of the present invention, a refrigeration cascade system includes a refrigeration system and an absorption system. The refrigeration system is configured: (i) to be powered at least in part by electricity; and (ii) to be thermally coupled to a load powered by electricity. The absorption system thermally coupled to the refrigeration system and configured to remove heat rejected by the refrigeration system. The thermal coupling between the refrigeration system and the absorption system enables a refrigeration system condensing temperature and an absorption system evaporating temperature which are within less than approximately ten degrees Celsius of each other.

A datacenter power and cooling system includes an electric power system, a server rack, a refrigeration system and an absorption system. The server rack is powered by the electric power system. The refrigeration system is powered at least in part by the electric power system and is thermally coupled to the server rack to remove heat from it. The absorption system is thermally coupled to the refrigeration system and configured to remove heat rejected by the refrigeration system. The thermal coupling between the refrigeration system and the absorption system enables a refrigeration system condensing temperature of less than approximately twenty degrees Celsius.

According to a further aspect of the present invention, a method of reducing energy consumption by a computer chip powered by a power source includes several steps. At a first coupling step, the computer chip is thermally coupling to a refrigeration system. At a powering step, the refrigeration system is powered, at least in part, by the power source. At a second coupling step, the refrigeration system is thermally coupling to an absorption system. The thermal coupling between the refrigeration system and the absorption system enables a refrigeration system condensing temperature and an absorption system evaporating temperature which are within less than approximately ten degrees Celsius of each other.

BRIEF DESCRIPTION OF THE DRAWINGS

The present invention will be more fully understood and appreciated by reading the following Detailed Description in conjunction with the accompanying drawings, in which.

DETAILED DESCRIPTION

Figure 4:
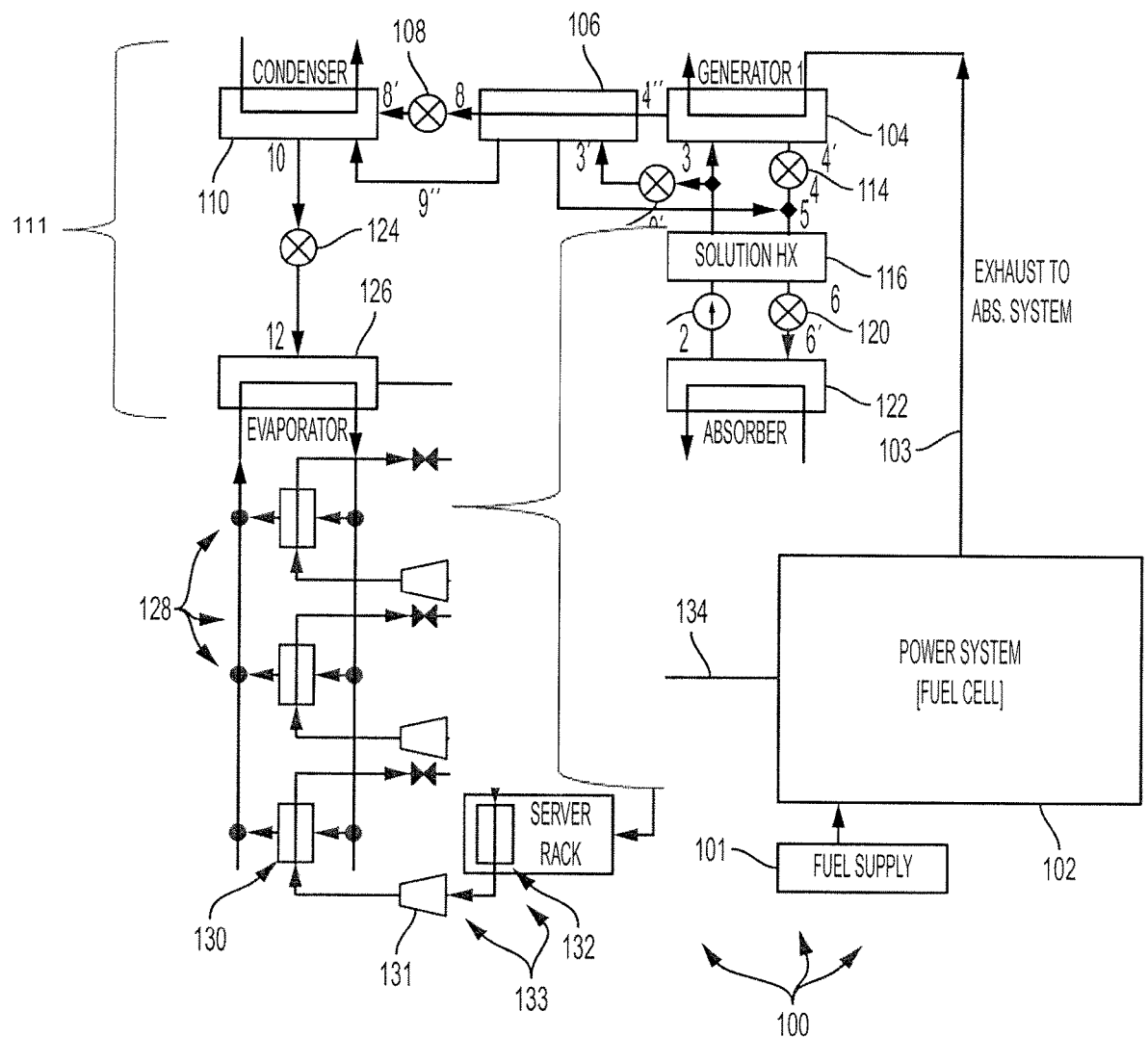
FIG. 4 is a block diagram that illustrates a PARCS with distributed RS according to an embodiment of the present invention.

Reference will now be made in detail to the present preferred embodiments of the invention, examples of which are illustrated in the accompanying drawings. As shown in FIG. 4, a first embodiment of an on-site combined Power And Refrigeration Cascade System ("PARCS") 100 according to the present invention includes: fuel supply 101; electric power system ("PS") 102; exhaust to abs system line 103; generator 104; abs component 106; valve 108; condenser 110; valve 112; valve 114; solution HX 116; pump 118; valve 120; absorber 122; valve 124; evaporator 126 (the generator 104, condenser 110, absorber 122, and evaporator 126 comprising an absorption chiller 111); chilled water return manifold assembly 128; condensers 130; compressors 131; evaporators 132; server rack assembly 133; and DC power to data center line 134. The PS is preferably a heat-engine-driven electric generator or a fuel cell, that produces both DC electric power and medium-to-high-grade waste heat. The components are interconnected as shown in FIG. 4 to make the PARCS system 100.

The electric power output of the PS, which could be DC, AC or a combination of the two, is split between: (i) DC power to data center line 134 (which supplies an electric load in the form of server rack assembly 133); and (ii) a complementary portion supplied to an electrically-driven refrigeration system (RS) 128, 130, 131, 132, 133. The RS hardware may take various forms, now known or to developed in the future, such as, vapor-compression (VC), reversed Brayton (RB), reversed Stirling (RS), thermo-electric (TE), magneto caloric (MC), or other types of refrigeration systems. The heat rejected by the RS is pumped to ambient air by means of an absorption heat pump system (ABS) 104, 106, 108, 110, 112, 114, 116, 118, 120, 122, 124, 126. The ABS is activated by the exhaust heat from the power system over line 103.

The ABS condenser 110 and absorber 122 could be either water-cooled or air cooled (water-cooled is preferred because of its higher efficiency and compactness). In this fashion, the ABS and the RS subsystems are thermally integrated in a high-efficiency thermo-mechanical (e.g., ABS/VC) or thermo-electric (e.g., ABS/TE) cascade. In this embodiment, the RS is depicted as a VC system (VCS).

Figure 1:
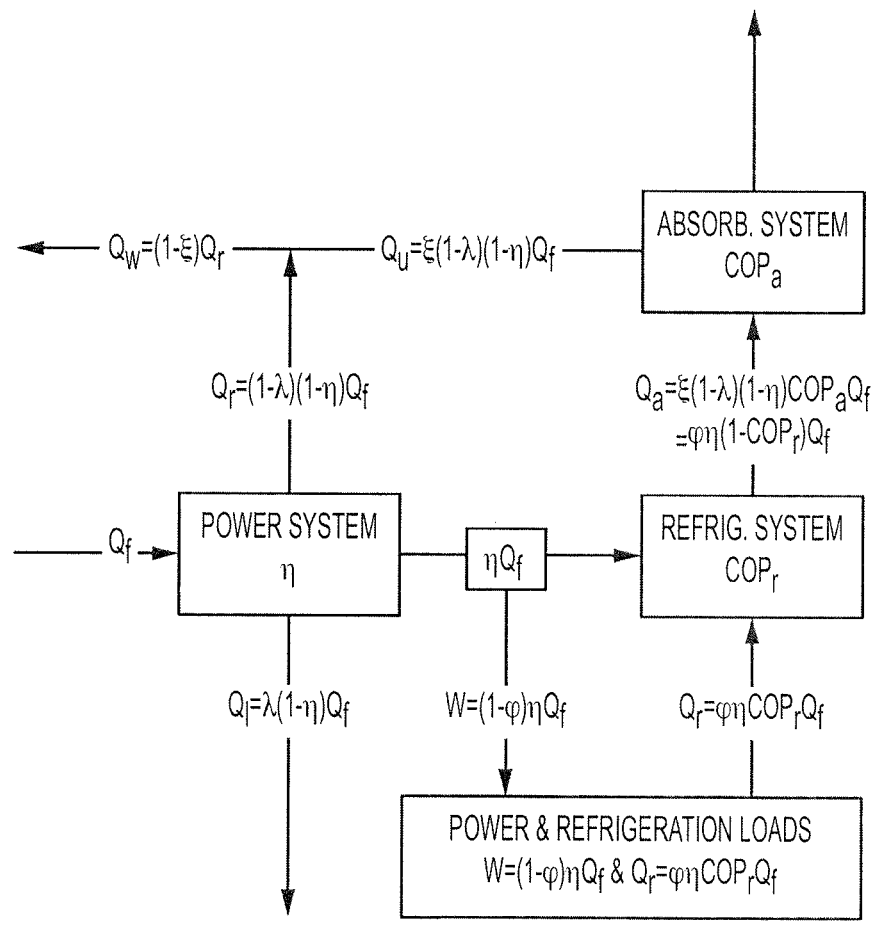
FIG. 1 is a high-level energy flow diagram of a first embodiment of a PARCS according to the present invention.

As shown in FIG. 1, $\eta$ is the thermal efficiency of the PS, $\lambda$ is the fraction of its waste heat that is not recoverable (e.g., radiation loss), $\xi$ is the waste heat utilization efficiency in the ABS generator, and $\varphi$ is the fraction of the PS output needed to drive the RS. The coefficient of performance (COP) of the ABS based on its generator heat input is $COP_a$ and that of the RS based on its work input is $COP_r$. The COP of the RS depends on its cold- and warm-side temperatures (the evaporator and condenser saturation temperatures in the VCS). In the PARCS of an embodiment of the present invention, the heat rejection temperature of the RS is dictated by the evaporator temperature of the ABS, which, for LiBr—H$_2$O systems, is typically in the 5-10° C. range.

In accordance with an embodiment of the present invention, for a data center application, the refrigeration system may be either centralized and integrated with the ABS using a combined condenser/evaporator, or distributed, with one (or more) RS per computer rack. The heat rejected from the distributed RS units is transferred to chilled water distributed from a central waste-heat driven ABS. The RS and the ABS could be coupled in one of at least two ways: (i) in the centralized configuration, an integrated condenser/evaporator heat exchanger of superb effectiveness allows the condensing temperature in the VCS to be only a few degrees higher than the evaporating temperature in the ABS. The VCS evaporator chills a heat transfer fluid (anti-freeze) that is distributed to liquid-cooled rack cabinets; or (ii) in the distributed configuration, the ABS chilled water is delivered via a supply manifold to the VCS condenser in each computer rack, and returned to the ABS evaporator (water chiller) via a return manifold. The VCS evaporator in the rack is used either to chill air that cools the electronic components in the rack, or to cool the electronic components directly.

In accordance with an embodiment of the present invention, in both of the configurations described herein, the condensing temperature of the VCS could be maintained herein 15° C., compared with the 35° C. typical of water-cooled conventional VCS. As a result, the $COP_r$ of the RS is substantially higher than that of a conventional VCS. The lower RS condensing temperature in the PARCS of an embodiment of the present invention also enables lower temperature refrigeration with less deterioration in capacity and COP, compared with a conventional VCS. This is one of the main advantages of the PARCS of an embodiment of the present invention. This advantage may also obviate the need for 2-stage VC and liquid injection to moderate the compressor discharge temperature in low-temperature refrigeration, where high compression pressure ratios are experienced (Liquid injection degrades refrigeration performance).

In accordance with an embodiment of the present invention, an important advantage of the PARCS of an embodiment of the present invention is its suitability for computer data centers. In data center applications the power consumption is dominated by computer needs (DC power), and the refrigeration load is nearly equal to computer power dissipation. Therefore, referring to the notation in FIG. 1:

$$Q_r \approx W$$

$$\varphi COP_r \approx 1-\varphi$$

$$\varphi \approx 1/(1+COP_r), \qquad \text{Eq. (1)}$$

where $Q_r$ is the refrigeration load, and W is the computer power consumption. The performance of the RS in this case also depends on that of the waste-heat-driven ABS, whose evaporator acts as the heat rejection means for the RS. For the data center application, the RS heat rejection temperature and rate are tied to the ABS evaporator temperature and capacity, viz;

$$\varphi\eta(1+COP_r)=\xi(1-\lambda)(1-\eta)COP_a, \qquad \text{Eq. (2)}$$

For given values of $\xi$, $\lambda$, $COP_a$, and $COP_r$, Eq. (2) implies that, for a grid-independent PARCS of an embodiment of the present invention, $\varphi$ should not exceed a limiting value, $\varphi^*$, given by:

$$\varphi^*=\xi(1-\lambda)((1-\eta)COP_a/[\eta(1+COP_r)]\geq\varphi. \qquad \text{Eq. (3)}$$

This relationship highlights the importance of matching the PS, ABS and RS in stand-alone, grid-independent PARCS applications of an embodiment of the present invention. In the case of a data center where Eq. (1) applies, the combination of Eq. (3) with Eq. (1), yields the condition for the PARCS to match both the power and refrigeration needs of the data center, namely:

$$\xi((1-\eta)COP_a/\eta\geq 1, \qquad \text{Eq. (4)}$$

which depends entirely on the PS and ABS characteristics, but, notably, not on those of the RS. The product of $\xi$ and $(1-\lambda)$ represents an overall waste heat utilization efficiency, $\zeta$. Thus, Eq. (4) may be written as:

$$\zeta((1-\eta)COP_a/\eta\geq 1, \qquad \text{Eq. (4a)}$$

Figure 2:
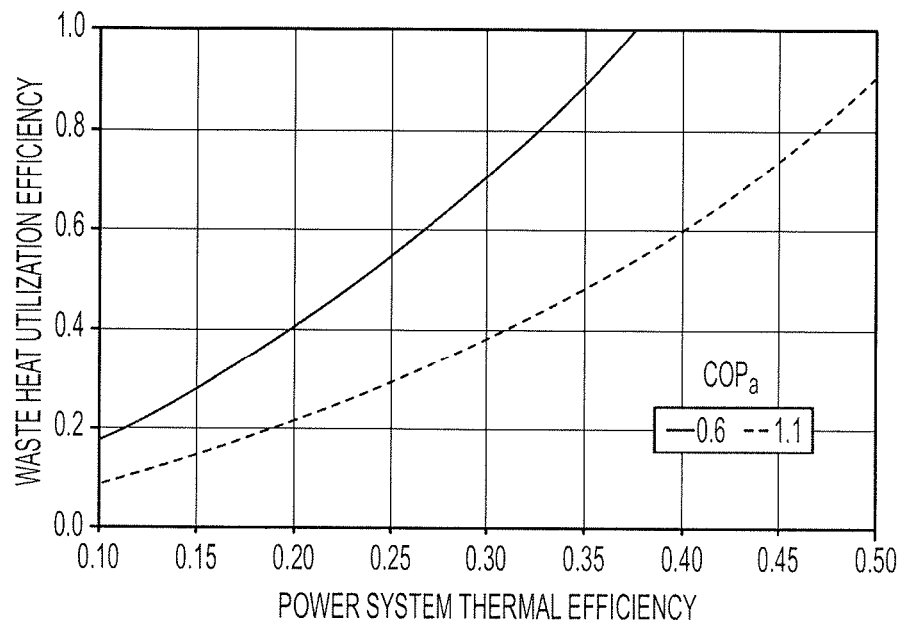
FIG. 2 is a graphical illustration that illustrates a minimum waste heat utilization efficiency in an ABS generator according to an embodiment of the present invention.

In accordance with an embodiment of the present invention, this relationship, as described herein, is illustrated in FIG. 2. FIG. 2 shows the minimum value of $\zeta$ that satisfies the constraint implied by Eq. (4) for typical single-effect and double-effect ABS $COP_a$. It can be seen that higher waste heat utilization efficiencies are required in order to satisfy the matching constraint (Eq. 4a) when a higher efficiency PS is employed. These conditions favor power generation systems with a higher-temperature waste heat, such as gas turbines, or molten-carbonate or solid-oxide fuel cells. A high waste heat utilization efficiency could also be achieved with medium-temperature waste heat if it is mostly in latent form (for example, extracted from a condensing PS exhaust effluent). It is also evident that single-effect ABS cannot satisfy the data center matching constraint when a higher efficiency PS is employed ($\eta>0.35$). FIG. 4, as discussed in further detail herein, also indicates that the matching constraint can be more easily satisfied with double-effect ABS, even for higher-efficiency PS (for example, medium- and high-temperature fuel cells).

In accordance with an embodiment of the present invention, $\eta$ and $\lambda$ depend on the type of the PS selected, and $\xi$ and $COP_a$ depend on the type of the ABS that is compatible with the temperature and quality of the selected PS waste heat. For example, a PS whose waste heat that is at 100° C. or lower would be compatible with a single-effect ABS with a typical $COP_a$ of about 0.6, whereas a PS whose waste heat that is available at 125° C. or higher would be compatible with a double-effect ABS with a typical $COP_a$ higher than 1.0. Generally, the higher the temperature at which the PS waste heat is available, the higher the $COP_a$ of the ABS and the waste heat utilization efficiency (for a given ABS cycle).

Figure 3:
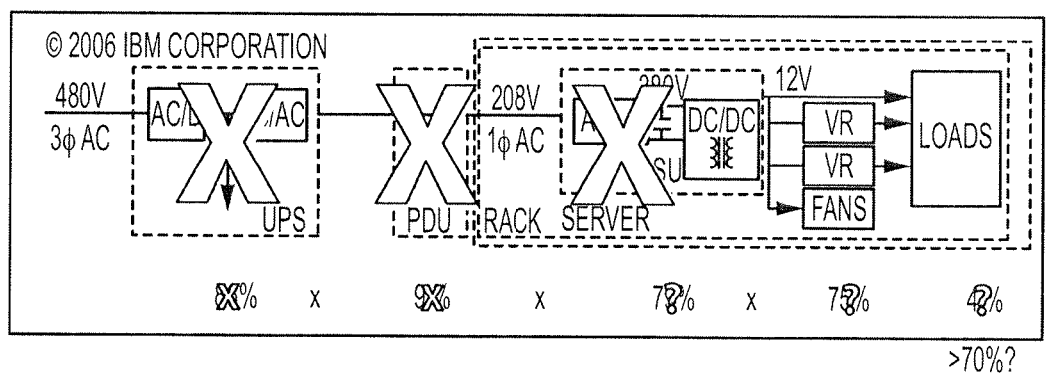
FIG. 3 is a high level schematic that illustrates potential savings from on-site "native" DC power supply.

In accordance with an embodiment of the present invention, another important aspect of the PARCS of an embodiment of the present invention when used with data centers, is its ability to generate "native" DC power, possibly at several voltages suitable for powering computer systems. This has the potential substantially to reduce power conversion and conditioning losses. Conventional grid-powered systems could dissipate close to 50% of their AC power input in the multiple rectifier/inverter/power-conditioning stages required for a data center. This advantage is especially present when a fuel cell is used as the PS, but could be obtained also with a thermo-mechanical (e.g., a combustion engine) PS driving DC electric generators. This is highlighted in FIG. 3, which shows the various stages of AC/DC power conversion that can be either eliminated or made more efficient by using an on-site DC power supply as disclosed here. The overall efficiency of this subsystem could be increased from ~50% value typical of grid-supplied equipment to better than 70% if native DC power is available on-site.

In accordance with an embodiment of the present invention, FIG. 4 shows a preferred embodiment of PARCS with distributed RS in further detail. FIG. 4 includes a fuel cell PS, distributed single-stage refrigeration systems (one per rack), and a waste-heat driven water-cooled double-effect LiBr—$H_2O$ ABS providing chilled water to cool the condensers of the distributed VC RS. The fuel cell is of the medium- or high-temperature type (for example, phosphoric acid for medium-temperature, or molten-carbonate or solid-oxide for high-temperature). Although FIG. 4 shows VC RS, a reversed Stirling, TE or MC RS could also be used.

Figure 5:
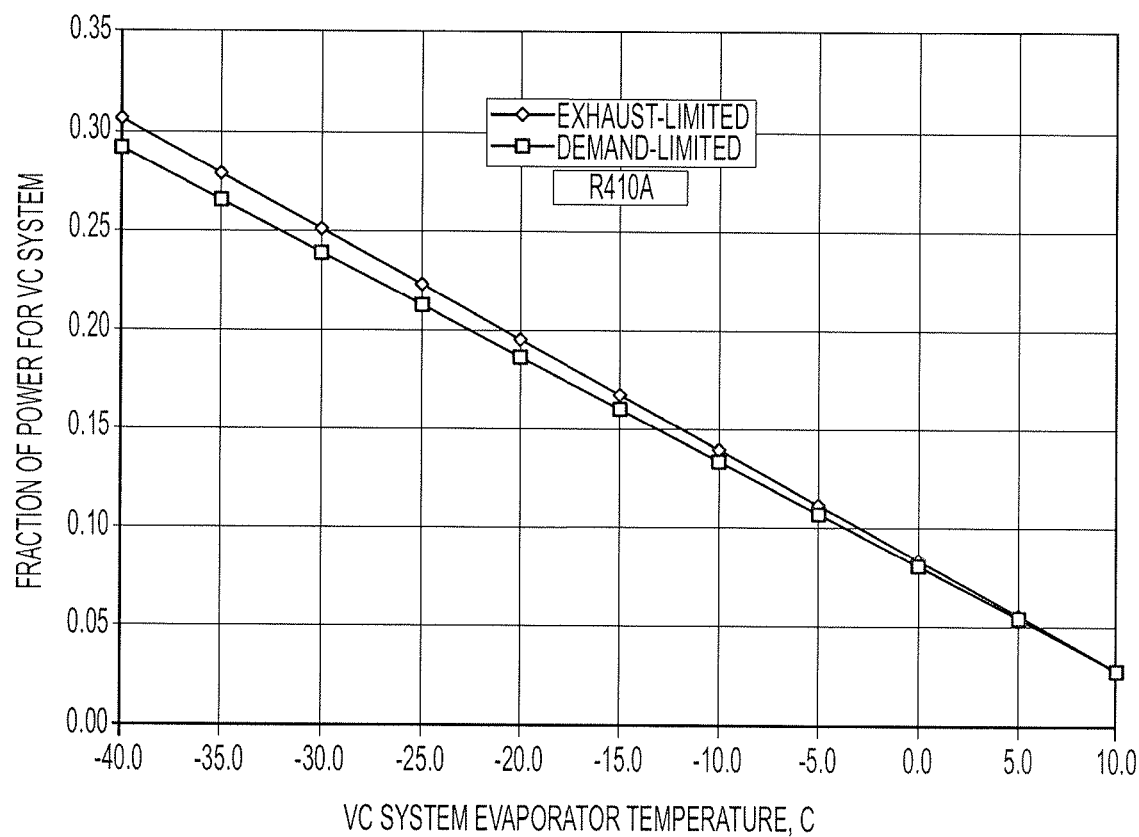
FIG. 5 is a graph showing the power allocation of the first embodiment PARCS.

In accordance with an embodiment of the present invention, to illustrate the performance advantage of the disclosed PARCS of an embodiment of the present invention for data center applications, a PARCS similar to the one shown in FIG. 4 was analyzed. The RS capacity (central or distributed) is matched to the cooling demands of the data center. FIG. 5 shows the fraction of the PS output diverted to the VCS (FIG. 1) for cooling a data center over a range of evaporator temperatures from 10° C. (typical for air-conditioning), down to −40° C. (typical for low-temperature refrigeration in supermarkets). The PS is assumed to be a fuel cell with a thermal efficiency of 40% and a waste heat temperature of ~150° C. (~300° F.). Because the fuel cell's native output is DC, it is possible to reduce the data center power demand by as much as 35% by eliminating the AC/DC conversions and voltage transformers used in conventional grid-supplied data centers. The ABS is assumed to be a water-cooled double-effect LiBr—$H_2O$ type operated at a moderate generator temperature (<100° C.) to achieve a thermal $COP_a$ of 1.05 with heat rejection (absorber and condenser) at 35° C., and an evaporator saturation temperature of 10° C. Two lines are shown, one representing matching the data center power demands (Eq. 1) and the other representing matching constrained by the capacity of the waste-heat-driven ABS. As shown in FIG. 5, it is evident that the PARCS of an embodiment of the present invention is an excellent "match" over a wide range of cold-side temperature for the type of correlated computing and refrigeration power demands presented by a data center.

In accordance with an embodiment of the present invention, as described below, the PARCS of an embodiment of the present invention allows efficient low temperature refrigeration. There are several advantages of operating computing hardware at lower temperature: higher reliability, potential for improved performance, and potential for reducing heat dissipation (See R. R. Schmidt and B. D. Notohardjono, *High-End Server Low-Temperature Cooling*, IBM J. OF RES & DEV, vol 46, No. 6 (November 2002)). For a given cooling scheme, the heat dissipation rate of computer systems can depend both on the computing performance (for example, clock rate) and operating temperature:

$$\overline{Q}_d = F(P, T), \quad \text{Eq. (5)}$$

where $Q_d$ is the computing power consumption at a computing performance level P and internal temperature of the heat dissipating component, $T_i$. This temperature is related to the coolant temperature, $T_c$, the cooling scheme, and the heat dissipation rate, $Q_d$ through the familiar heat transfer equation:

$$Q_d = (T_i - T_c)/R_\theta, \quad \text{Eq. (6)}$$

in which $R_\theta$ represents the overall thermal resistance from the chip core to the coolant, which depends on both the cooling scheme and the internal thermal resistance of the electronic component (e.g., CPU die).

Figure 6:
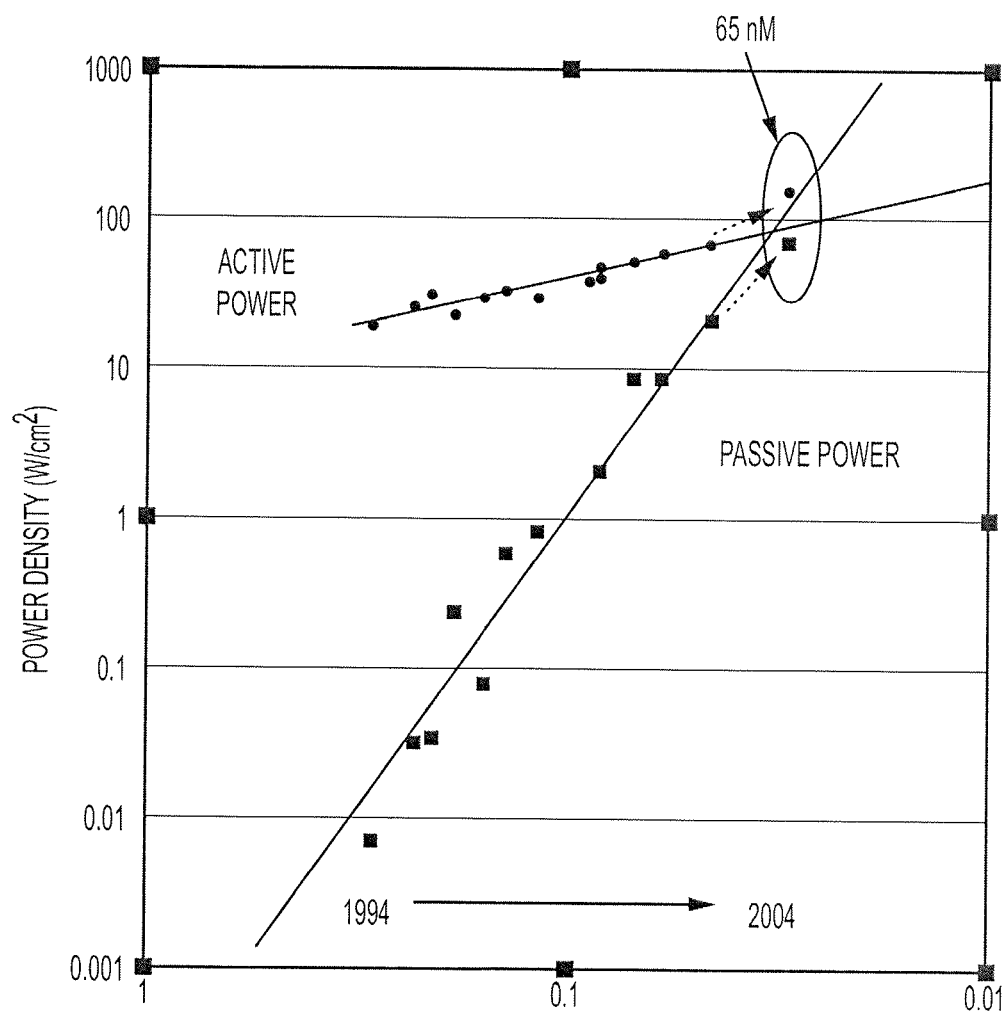
FIG. 6 is a graph showing the evolution of active and passive power dissipation in CMOS CPUs associated with the first embodiment PARCS.

In accordance with an embodiment of the present invention, the relationship represented by Eq. (5) can be inferred from the power dissipation characteristics of CMOS chips, which can be divided into active and passive components (the active component depends on the clock frequency; the passive component is present even if the clock is stopped). Passive power dissipation has surpassed active power dissipation in modern high-density, low voltage CMOS CPUs with low threshold voltage (as shown in FIG. 6). The active component is nearly independent of temperature, but the passive component, which is dominated by the dissipative effect of subthreshold leakage currents, is a strong function of temperature.

In accordance with an embodiment of the present invention, generally, active power can depend on clock frequency, f, and voltage, V:

$$Q_a = C_a V^2 f, \quad \text{Eq. (7)}$$

and the leakage-dominated passive component to be of the form:

$$Q_P = C_P V \exp\left(\frac{-qV_{th}}{k_B T_i}\right), \quad \text{Eq. (8)}$$

where q is the electron charge, $V_{th}$ is threshold voltage, and $k_B$ is the Boltzmann constant. The total power dissipation from a CMOS chip can thus be expressed as:

$$Q_d = C_a V^2 f + C_P V \exp\left(\frac{-qV_{th}}{k_B T_i}\right). \quad \text{Eq. (9)}$$

Equations (6) and (9) can be combined to yield an implicit expression of the form:

$$Q_d = C_a V^2 f + C_P V \exp\left(\frac{-qV_{th}}{k_B (T_c + Q_d R_\theta)}\right), \quad \text{Eq. (10)}$$

which may be expressed explicitly as a function of f, V, and $T_c$, with $R_\theta$ as a parameter:

$$Q_d = F(f, V, T_c; R_\theta). \quad \text{Eq. (11)}$$

In accordance with an embodiment of the present invention, the actual relationship (Eq. 11) can be much more complex than the one derived above, but the relative trends can be examined by using the simple model represented by Eq. (10), in which the clock frequency is used as a surrogate for the performance, P.

Figure 7:
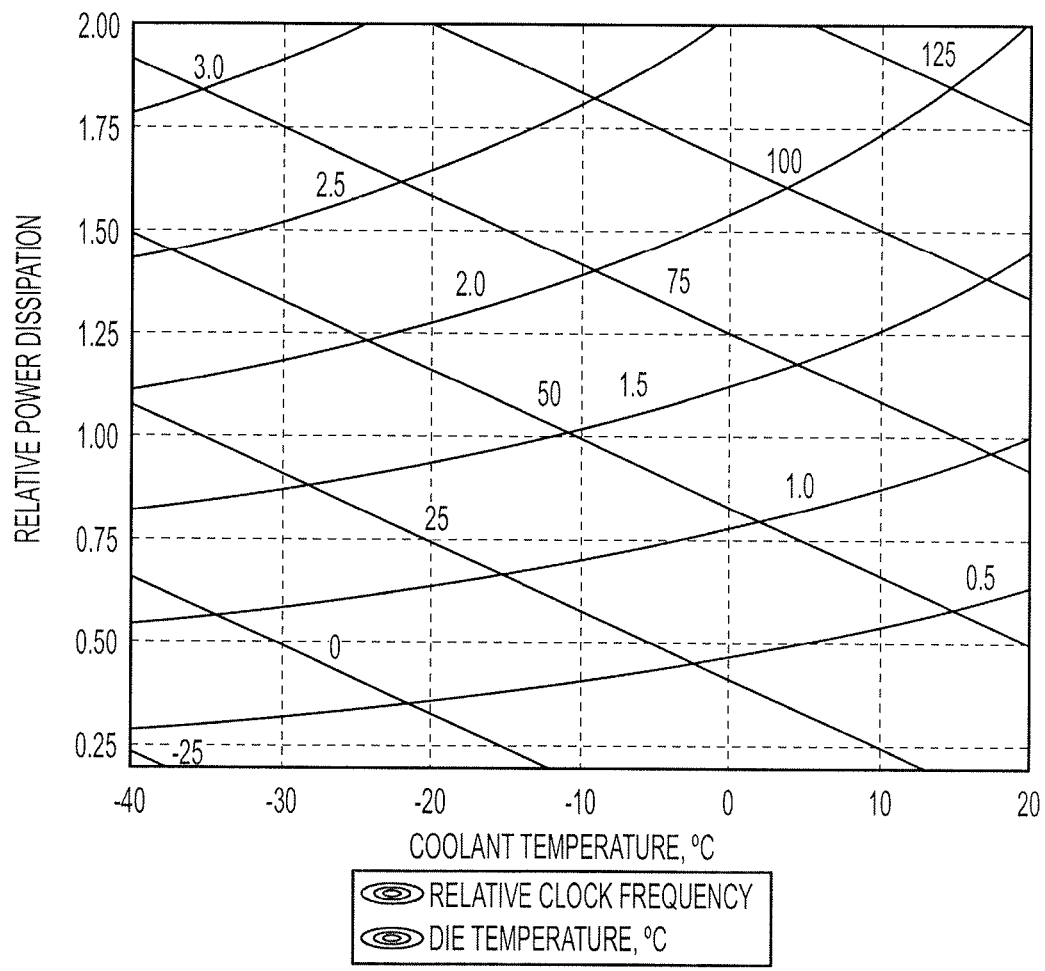
FIG. 7 is a graph showing typical CMOS chip thermal characteristics of the first embodiment PARCS.

In accordance with an embodiment of the present invention, FIG. 7 illustrates the relationship implied by Eq. (10) in normalized form. Charts of this qualitative nature can be produced for a chip, an entire motherboard, a server, or a rack, for other performance metrics, and cooling schemes ($R_\theta$). The iso-performance lines in FIG. 7 are only mildly curved and may be treated as straight lines in simplified parametric analysis. Therefore, whether operating at a lower temperature would lead to a reduction in heat dissipation for a given computing performance level and cooling scheme will depend on the parameter:

$$\theta = \left(\frac{\partial \overline{Q}_d}{\partial T_c}\right)_{P, V, R_\theta}. \quad \text{Eq. (12)}$$

It has been reported that that IBM's 750FX and 750GX processors exhibit a 0.05 W/° C. and 0.1 W/° C. slopes, respectively. These translate into θ values in the 0.5%/° C. to 1.0%/° C. range. (See D. Elson, *750X and 750GX Power Dissipation Presentation*, (Feb. 15, 2005). For this analysis, the effects of θ on PARCS performance of an embodiment of the present invention for three values of θ (0%, 0.5% and 1% per ° C.) are examined, as discussed herein.

Figure 8:
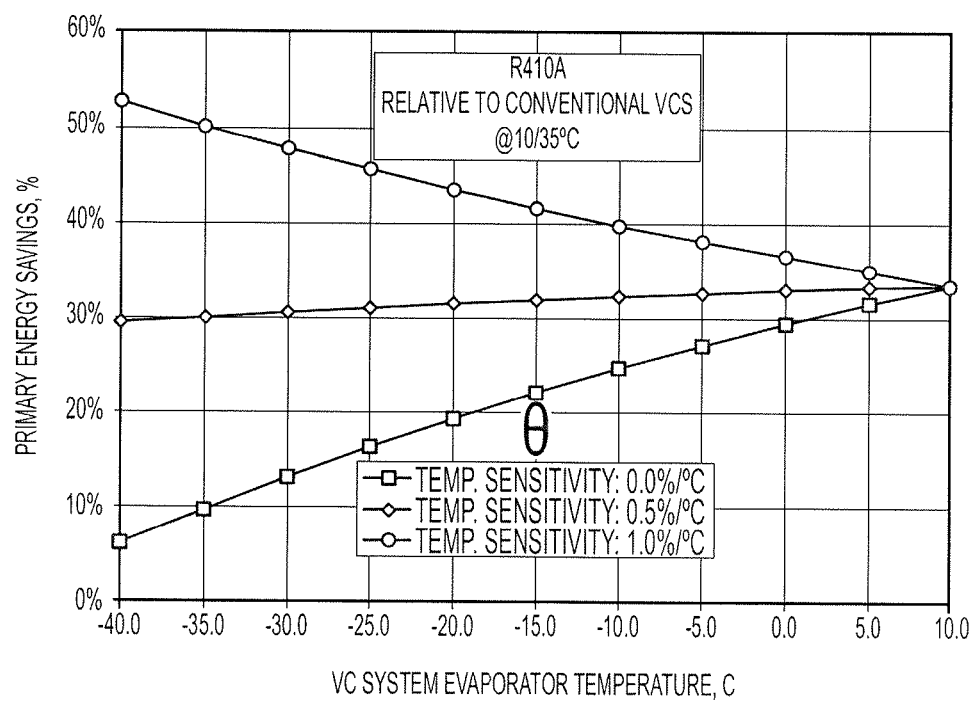
FIG. 8 is a graph showing exemplary primary energy savings due to the first embodiment PARCS, where θ=0.0, 0.5, and 1.0%/° C.

In accordance with an embodiment of the present invention, FIG. 8 presents energy savings trends of the PARCS of an embodiment of the present invention relative to a conventional grid-supplied system operating with a 10° C. saturated evaporator temperature and 35° C. saturated condenser temperature, designated here as CS-10/35° C. The overall thermal efficiency of the grid-supplied power, including remote power plant and transmission/distribution losses, was taken as 30%. The savings displayed in FIG. 9 does not include the potential savings from the use of on-site DC power supply in PARCS of an embodiment of the present invention. The PARCS of an embodiment of the present invention provides primary energy savings in excess of 33% compared with the CS-10/35° C. baseline, even if operated at the same 10/35° C. conditions as CS-10/35° C. This is due to the higher thermal efficiency of the fuel cell power plant, and because of the utilization of the fuel cell's waste heat in the ABS to lower the VCS condensing temperature.

In accordance with an embodiment of the present invention, FIG. 8 also shows the sensitivity of primary energy savings to θ. With a θ=0%, the primary energy savings declines as the coolant temperature is lowered at the same chip performance level, decreasing to less than 10% at −40° C. The savings is nearly flat for θ=0.5%/° C. and increases steadily to reach a value in excess of 50% at −40° C. for θ=1.0%/° C. This demonstrates that newer, denser, lower voltage CMOS chips could benefit significantly from low temperature operation. The savings are even higher when account is made for the substantial energy savings associated with using the fuel cell's native DC output, as discussed herein.

Figure 9:
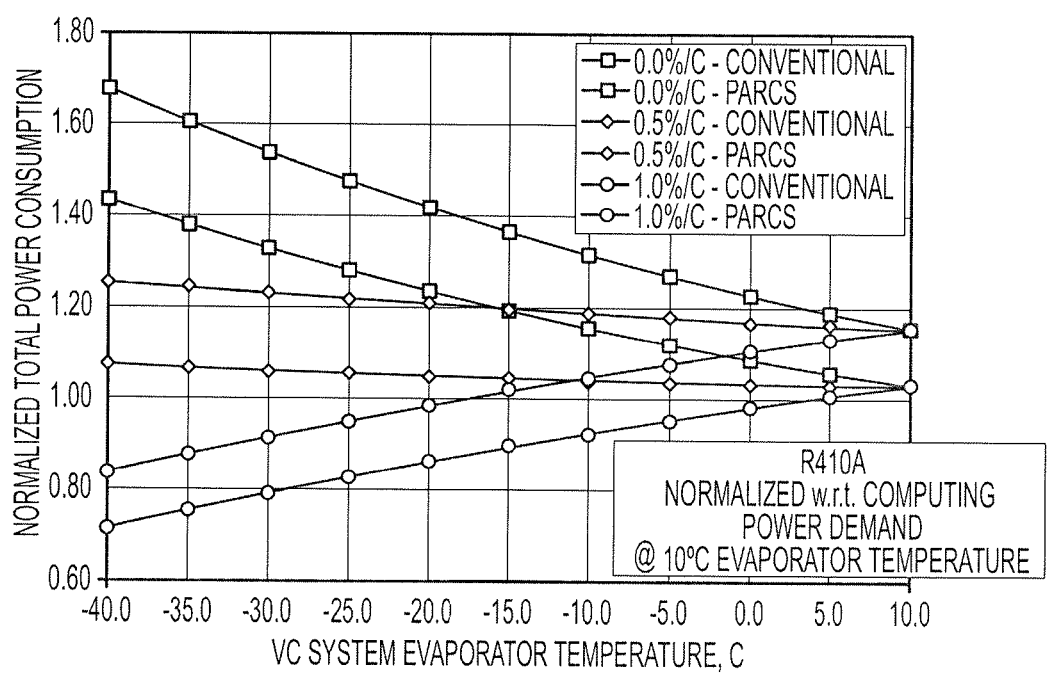
FIG. 9 is a graph comparing power demand, where θ=0.0, 0.5, and 1.0%/° C., between a conventional grid-supplied system and the first embodiment PARCS.

In accordance with an embodiment of the present invention, FIG. 9 displays the variation of the total power requirements (for data processing and refrigeration), normalized with respect to the data processing (IT) power demands of a conventional grid-connected system cooled by a 10° C. evaporator. The power rating of the refrigeration equipment and the total power demand of the data center are considerably more favorable with PARCS of an embodiment of the present invention compared with a conventional VCS at any low-side temperature. The reduction in total power demand relative to CS-10/35° C. is evident down to −40° C. for θ=0.5% and 1.0%/° C., even without the advantage of on-site DC power generation. This trend is also present, albeit to a lesser extent, when the IT load is independent of operating temperature (i.e., θ=0.0%/° C.). Whereas the primary energy savings of PARCS of an embodiment of the present invention relative to CS-10/35° C. remains positive over the entire range of evaporator temperatures from 10° C. to −40° C. (FIG. 8), PARCS' power demand is lower than that of CS-10/35° C. only down to about −10° C.

Figure 10:
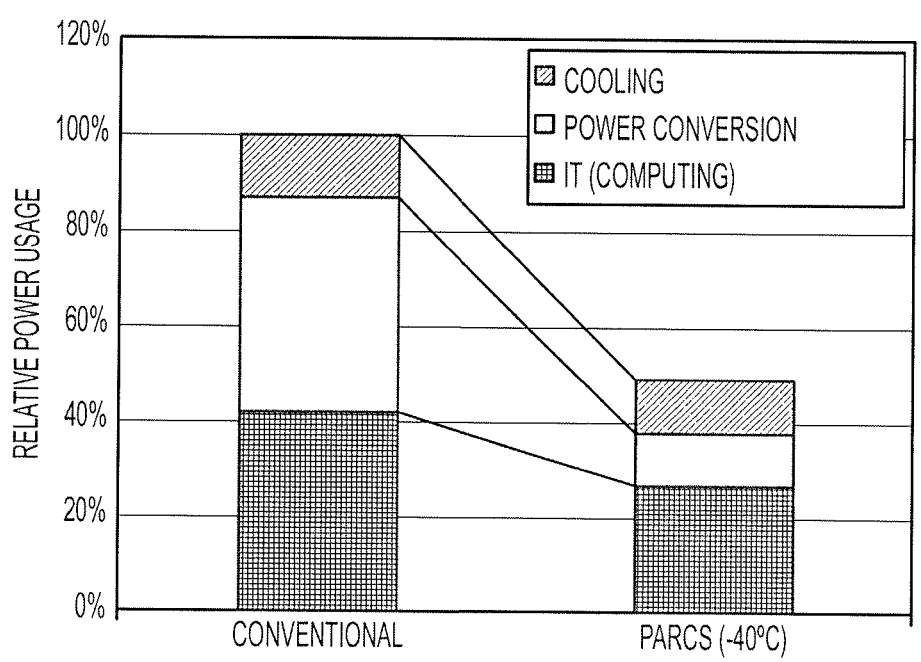
FIG. 10 is a graph comparing power demands, where θ=0.75%/C., between a conventional system and the first embodiment PARCS.

FIG. 10 compares the power demands of PARCS of an embodiment of the present invention relative to a conventional system, taking into account the advantage of on-site DC power generation. The grid-connected power supply system shown in FIG. 3 has an overall efficiency of 48% when operated at conventional data center temperature. With a PARCS according to the present invention, the power conversion efficiency is raised to 75% as a result of the elimination the various AC/DC conversion steps. The PARCS power conversion hardware is assumed to be maintained at the same temperature as in a conventional data center. With PARCS of an embodiment of the present invention, a θ=0.75%/° C. It can be seen that the combined improvement due to DC power conversion, low temperature operation (−40° C.) and fuel-cell based cogeneration included in PARCS according to the present invention lead to a total power reduction in excess of 50%. It should be noted that when these power reductions are translated into primary energy savings, PARCS of an embodiment of the present invention advantage over the conventional system rises to an even more impressive 65%. This is because of the higher thermal efficiency of the fuel cell (40%) compared with grid power (30%).

In accordance with an embodiment of the present invention, the use of PARCS of an embodiment of the present invention can result in substantial reductions in primary energy consumption and power ratings of power- and cooling-intensive applications such as data centers, and the like. When multiple PARCS with appropriate spares are used, reliable grid-independent operation can be achieved. When fuel cells are used in PARCS of an embodiment of the present invention, DC power can be supplied directly to the load at multiple voltages, eliminating the multiple energy-dissipating AC/DC electric power conversion and conditioning steps in a grid-connected power supply system. The primary energy savings potential of the DC power generation and the RS/ABS cooling cascade afforded by a fuel-cell based PARCS could exceed 60%, even with low-temperature refrigeration. The benefits of the latter for data centers include higher reliability, improved performance, enhanced ability to handle the ever increasing heat fluxes produced by modern computer systems, for newer denser low voltage CMOS chips, and reduction in leakage power dissipation.

In accordance with a preferred embodiment of the present invention, the PARCS of an embodiment of the present invention is ideally suited to data centers, where the electric and refrigeration loads are steady and strongly correlated. The matching parameter, φ, can be increased or decreased by changing the VCS condenser/ABS evaporator temperature. By raising this temperature, it is possible to lower the maximum generator temperature and maximum solution concentration in the PARCS' ABS than for a conventional ABS unassisted by the cascade effect of the PARCS. This also results in a higher $COP_a$ for the PARCS' ABS. The improved conditions under which the ABS would work in PARCS of an embodiment of the present invention leads to a lower susceptibility to corrosion and crystallization—two major risks in LiBr—$H_2O$ absorption systems (the vast majority of commercially-available ABS). With a lower RS condensing temperature, lower initial cost and higher reliability would also be realized.

While PARCSs according to the present invention can be constructed from commercially-available phosphoric acid fuel cells, double effect LiBr—$H_2O$ absorption chillers, and conventional vapor compression refrigeration systems, it can also be configured to operate with other thermo-mechanical power generation systems such as gas turbines (micro-turbines) and gas engines, or with advanced high-temperature fuel cells (molten carbonate and solid oxide). It can also be configured with other RS such as Stirling, thermoelectric or magneto-caloric systems, and with other types of waste heat-activated heat pumps besides LiBr—$H_2O$ ABS (e.g., adsorption).

While several embodiments of the invention have been discussed, it will be appreciated by those skilled in the art that various modifications and variations of the present invention are possible. Such modifications do not depart from the spirit and scope of the invention.

Definitions

The following definitions are provided to facilitate claim interpretation:

Present invention: means at least some embodiments of the present invention; references to various feature(s) of the "present invention" throughout this document do not mean that all claimed embodiments or methods include the referenced feature(s).

Grid-independent: at least substantially grid-independent.

To the extent that the definitions provided above are consistent with ordinary, plain, and accustomed meanings (as generally shown by documents such as dictionaries and/or technical lexicons), the above definitions shall be considered supplemental in nature. To the extent that the definitions provided above are inconsistent with ordinary, plain, and accustomed meanings (as generally shown by documents such as dictionaries and/or technical lexicons), the above definitions shall control. If the definitions provided above are broader than the ordinary, plain, and accustomed meanings in some aspect, then the above definitions shall be considered to broaden the claim accordingly.

To the extent that a patentee may act as its own lexicographer under applicable law, it is hereby further directed that all words appearing in the claims section, except for the above-defined words, shall take on their ordinary, plain, and accustomed meanings (as generally shown by documents such as dictionaries and/or technical lexicons), and shall not be considered to be specially defined in this specification. In the situation where a word or term used in the claims has more than one alternative ordinary, plain and accustomed meaning, the broadest definition that is consistent with technological feasibility and not directly inconsistent with the specification shall control.

Unless otherwise explicitly provided in the claim language, steps in method steps or process claims need only be performed in the same time order as the order the steps are recited in the claim only to the extent that impossibility or extreme feasibility problems dictate that the recited step order (or portion of the recited step order) be used. This broad interpretation with respect to step order is to be used regardless of whether the alternative time ordering(s) of the claimed steps is particularly mentioned or discussed in this document.

What is claimed is:

1. A method of reducing energy consumption by a load powered by a power source, comprising:
   powering the load by the power source wherein the power source generates only direct current (DC) power without conversion to or from alternating current (AC) power;
   thermally coupling the load to a refrigeration system, wherein at least a portion of the load comprises at least one computer chip;
   powering the refrigeration system, wherein at least a portion of power is from the power source;
   thermally coupling the refrigeration system to an absorption system, wherein the absorption system has an absorption chiller which is in a cascaded arrangement with vapor-compressors of the refrigeration system, the absorption system configured to remove heat rejected by the refrigeration system, wherein the thermal coupling between the refrigeration system and the absorption system enables the absorption system having an evaporator temperature of less than zero degrees Celsius.

2. The method of claim 1, wherein the absorption system is driven by waste heat from the power source.

3. The method of claim 1, wherein the power source is selected from the group consisting of at least one fuel cell and at least one combustion engine.

4. The method of claim 1, wherein the power source is an on-site power source connected to the refrigeration system.

5. The method of claim 1, wherein the direct current (DC) power source comprises at least one fuel cell.

6. The method of claim 1, wherein the refrigeration system is selected from the group consisting of a vapor compression system, a reversed Brayton Cycle, a reversed Stirling Cycle, a thermo-electric system, and a magneto-caloric system.

7. The method of claim 1, wherein the absorption system is selected from the group consisting of a water-cooled absorption system and an air-cooled absorption system.

8. The method of claim 1, wherein the absorption system is selected from the group consisting of a single-effect absorption system and a multiple-effect absorption system.

9. The method of claim 1, wherein the refrigeration system is operable to match cooling demands of the load.

10. The method of claim 9, wherein at least a second portion of said load is selected from the group consisting of a data center, a display case, and a supermarket cooler.

11. The method of claim 10, wherein the computer chip comprises CMOS technology.

12. The method of claim 11, wherein the computer chip is located in a datacenter server rack.

13. The method of claim 1, wherein the thermal coupling between the refrigeration system and the absorption system enables a refrigeration system condensing temperature of less than fifteen degrees Celsius.

14. The method of claim 1, wherein the thermal coupling between the refrigeration system and the absorption system enables a refrigeration system condensing temperature and an absorption system evaporating temperature which are within less than ten degrees Celsius of each other.

* * * * *